(12) United States Patent
Selejan

(10) Patent No.: US 8,395,871 B2
(45) Date of Patent: Mar. 12, 2013

(54) DEVICE AND METHOD FOR DETECTING FAULTED PHASES IN A MULTI-PHASE ELECTRICAL NETWORK

(75) Inventor: Peter Selejan, Wescosville, PA (US)

(73) Assignee: ABB Technology AG, Zurich (CH)

( * ) Notice: Subject to any disclaimer, the term of this patent is extended or adjusted under 35 U.S.C. 154(b) by 393 days.

(21) Appl. No.: 12/527,532

(22) PCT Filed: Feb. 19, 2008

(86) PCT No.: PCT/US2008/002163
§ 371 (c)(1), (2), (4) Date: Aug. 17, 2009

(87) PCT Pub. No.: WO2008/103342
PCT Pub. Date: Aug. 28, 2008

(65) Prior Publication Data
US 2010/0053828 A1    Mar. 4, 2010

Related U.S. Application Data

(60) Provisional application No. 60/902,286, filed on Feb. 20, 2007.

(51) Int. Cl.
*H02H 3/00* (2006.01)
(52) U.S. Cl. .......................... 361/78; 361/62
(58) Field of Classification Search .............. 361/76, 361/78, 80, 62, 67, 87, 85
See application file for complete search history.

(56) References Cited

U.S. PATENT DOCUMENTS

| 4,409,636 A | 10/1983 | Brandt et al. |
| 4,453,191 A | 6/1984 | Wilkinson |
| 4,502,086 A | 2/1985 | Ebisaka |
| 4,639,817 A | 1/1987 | Cooper et al. |
| 4,795,983 A | 1/1989 | Crockett et al. |
| 4,825,327 A | 4/1989 | Alexander et al. |
| 5,072,403 A * | 12/1991 | Johns ............... 702/59 |
| 5,140,492 A | 8/1992 | Schweitzer, III |
| 5,783,946 A | 7/1998 | Yang |
| 5,796,629 A | 8/1998 | Calero et al. |
| 5,956,220 A | 9/1999 | Novosel et al. |
| 6,137,666 A | 10/2000 | Wang |
| 6,397,156 B1 | 5/2002 | Bachmann et al. |
| 6,417,791 B1 | 7/2002 | Benmouyal et al. |
| 6,625,278 B1 | 9/2003 | Hendricks et al. |
| 2010/0208403 A1 | 8/2010 | Das et al. |

FOREIGN PATENT DOCUMENTS

| EP | 0581015 A2 | 2/1994 |
| WO | PCT/US2008/002163 | 4/2008 |

* cited by examiner

*Primary Examiner* — Danny Nguyen
(74) *Attorney, Agent, or Firm* — Paul R. Katterle; Melissa J. Szczepanik

(57) ABSTRACT

The present invention is directed to a protective relay for providing protective control to a power system carrying three-phase power. The protective relay performs a faulted phase detection method wherein signal values representative of electrical properties of the power carried by the power system are received and are processed to produce processed signals, respectively. The processed signals have components of the signal values removed that are the same frequency as the nominal operating frequency of the power system. The process signal values are added to produce a sum, which is then divided by a predetermined number to yield a quotient. A determination is made whether the quotient falls within one of a plurality of predetermined ranges. This determination is used to determine whether the power system has a single-phase fault, a two-phase fault, or a three-phase fault.

20 Claims, 8 Drawing Sheets

DEVICE AND METHOD FOR DETECTING FAULTED PHASES IN A MULTI-PHASE ELECTRICAL NETWORK

BACKGROUND OF THE INVENTION

This invention relates to protective relays and more particularly to microprocessor-based protective relays.

There are a number of different types of protective relays. Generally, the main types of protective relays include directional protective relays, differential protective relays and distance protective relays.

A directional protective relay utilizes a directional protection scheme to determine whether a fault has occurred in a forward direction, i.e., in the direction of a protected zone, or in a reverse direction, i.e., in the direction of a non-protected zone. A directional protection scheme generally includes an operating element and a direction or polarizing element. The operating element compares an incoming current (or voltage) with a pre-defined current (or voltage) setting. In the case of an overcurrent directional protection scheme, the operating element generally makes a trip decision based on whether current exceeds a pre-defined current tolerance. The polarizing element determines the direction of a fault. The polarizing element may use torque equations to determine fault direction; positive torque results from forward faults and negative torque from reverse faults. The torque equations may use zero sequence voltage or current, or a negative sequence voltage for polarizing. Alternately, the polarizing element may use negative-sequence impedance. Tripping only occurs when the operating element indicates a fault condition and the polarizing element indicates that the fault condition is in the protected zone. Examples of directional protection schemes are disclosed in U.S. Pat. No. 4,825,327 to Alexander et al. and U.S. Pat. No. 4,453,191 to Wilkinson, both of which are hereby incorporated by reference.

Differential protective relays are frequently used for the protection of generators, transformers, and station buses. A differential protective relay operates on the principal of balancing or comparing secondary currents of current transformers located at input and output terminals of protected equipment. The differential protective relay is disposed between the current transformers such that no differential current flows through the protective relay under normal conditions because the secondary currents through the current transformers are balanced. When an external fault occurs current flow increases at both the input and output terminals of the protected equipment, but the balance between these currents is maintained. Therefore, the protective relay does not operate for the external fault condition. When a fault occurs in the protected equipment, the current flow on one side of the protected equipment is reversed, thus upsetting the normal current balance at the protective relay. The unbalanced condition causes a differential current to flow through the protective relay, and a differential protection scheme in the protective relay operates to trip the appropriate circuit breaker. An example of a differential protective relay is disclosed in U.S. Pat. No. 4,502,086 to Ebisaka, which is hereby incorporated by reference.

A distance protective relay utilizes the principle that an electrical line has an impedance that is proportional to the length of the line. A distance protective relay measures the impedance of a line and compares it to a pre-defined impedance setting proportional to the full length of the line. If the impedance is less than the pre-defined impedance, a fault is determined to have occurred. An impedance or RX diagram is often used to describe the characteristics of a distance relay. An RX diagram is a plot of R (abscissa) versus X (ordinate) and shows the characteristics of a relay in terms of the ratio of voltage to current and the angle between them. In an RX diagram, the numerical value of the ratio of voltage to current is shown as the length of a radius vector and the phase angle between voltage and current determines the position of the vector. In this manner, the operating characteristic of a relay is shown as a circle on an RX diagram, with the tripping of the relay occurring within the circle.

There are a number of different types of distance protection schemes that may be utilized by a distance protective relay. These schemes include impedance, reactance, mho, offset mho and quadrilateral schemes. An impedance scheme does not take into account the phase angle between the voltage and the current applied to it. For this reason, the operating characteristic of an impedance scheme, as represented in an RX diagram, is a circle with its center at the origin. A reactance scheme measures only the reactive component of impedance. A mho scheme or starting unit is essentially a reactance scheme with a directional element. The operating characteristic of a mho scheme, as represented in an RX diagram, is a circle which passes through the origin. The operating characteristic of an offset mho scheme, as represented in an RX diagram, is a circle that is shifted and includes the origin, thus providing better protection for close-in faults. A quadrilateral scheme combines directional and reactance characteristics with two resistive reach control characteristics.

Examples of distance protection schemes are shown in U.S. Pat. No. 5,956,220 to Novosel et al. and U.S. Pat. No. 5,140,492 to Schweitzer, III, both of which are hereby incorporated by reference.

In addition to the foregoing general classes of protective relays, there are protective relays that utilize delta filters to detect faults in power circuits. In such a relay, a delta filter receives a voltage or current time-varying waveform from a power circuit and subtracts the waveform present at a selected interval of time prior to the present time from the present time waveform. This operation is typically accomplished using a delay function of the filter. The selected interval of time is equal to a selected integral multiple of the time-varying voltage/current waveform time period. Conventionally, the delay is one power circuit cycle. Under normal conditions, when there is no disturbance or fault event, the output of the delta filter will be zero. Then, when an event or fault in the power circuit occurs, a change in the current or voltage waveform will occur and the delta filter will have a non-zero output. The magnitude of the change is indicative of the significance of the actual change in the power circuit, as represented by the voltage and/or current values.

Examples of protective relays that utilize delta filters include U.S. Pat. No. 4,409,636 to Brandt et al., U.S. Pat. No. 5,783,946 to Yang and U.S. Pat. No. 6,417,791 to Benmouyai et al., all of which are hereby incorporated by reference. In the Brandt et al. patent, a phase is determined to have a fault if its signal has an amplitude that is greater than a certain percentage (such as 40-60%) of the greatest amplitude of the phase signals. Such a method of determining a phase fault is rather rigid and does not permit different fault determination criteria for one phase, two phase and three phase faults.

It would therefore be desirable, to provide a protective relay with delta filters that has a more flexible fault determination that permits different fault determination criteria for one phase, two phase and three phase faults. The present invention is directed to such a protective relay.

SUMMARY OF THE INVENTION

In accordance with the present invention, a protective relay is provided for providing protective control to a power system carrying three-phase power. The protective relay includes a processor and at least one computer readable medium. Program instructions are stored on the at least one computer readable medium and are executable by the processor to perform a faulted phase detection method. In accordance with the method, signal values representative of electrical properties of the power carried by the power system are received. The signal values are processed to produce processed signals, respectively. The processed signals have components of the signal values removed that are the same frequency as the nominal operating frequency of the power system. The processed signals are added to produce a sum, which is divided by a predetermined number to yield a quotient. A determination is made whether the quotient falls within one of a plurality of predetermined ranges. The determination of whether the quotient falls within one of the predetermined ranges is used to determine whether the power system has a single-phase fault, a two-phase fault, or a three-phase fault.

Also provided in accordance with the present invention is a method for providing protective control to a power system carrying three-phase power. In accordance with the method, signal values representative of electrical properties of the power carried by the power system are received. The signal values are processed to produce processed signals, respectively. The processed signals have components of the signal values removed that are the same frequency as the nominal operating frequency of the power system. The processed signals are added to produce a sum, which is divided by a predetermined number to yield a quotient. A determination is made whether the quotient falls within one of a plurality of predetermined ranges. Using the determination of whether the quotient falls within one of the predetermined ranges, a determination is made whether the power system has a single-phase fault, a two-phase fault, or a three-phase fault.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
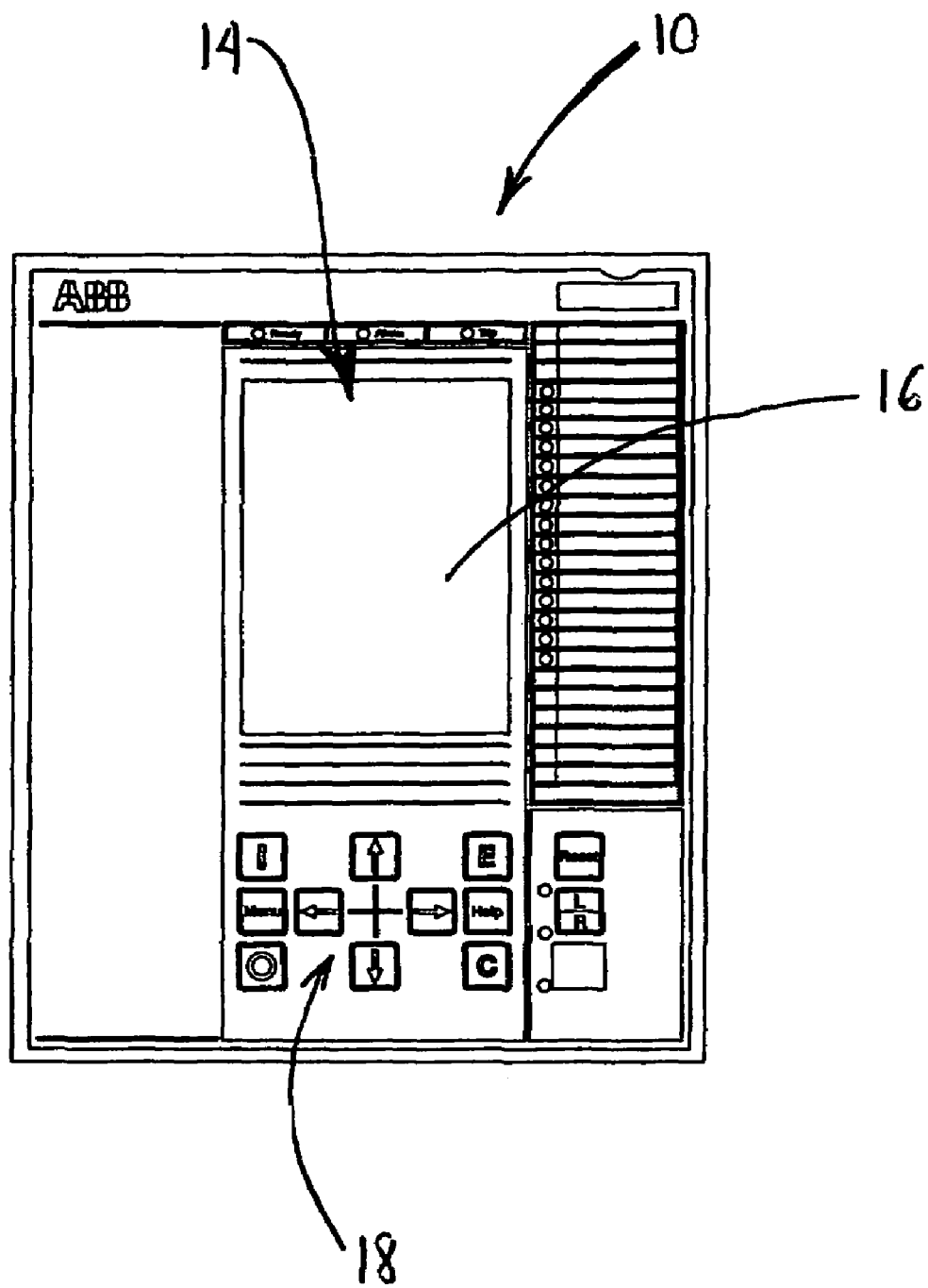
FIG. 1 is a front view of a protective relay embodied in accordance with the present invention.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Figure 2:
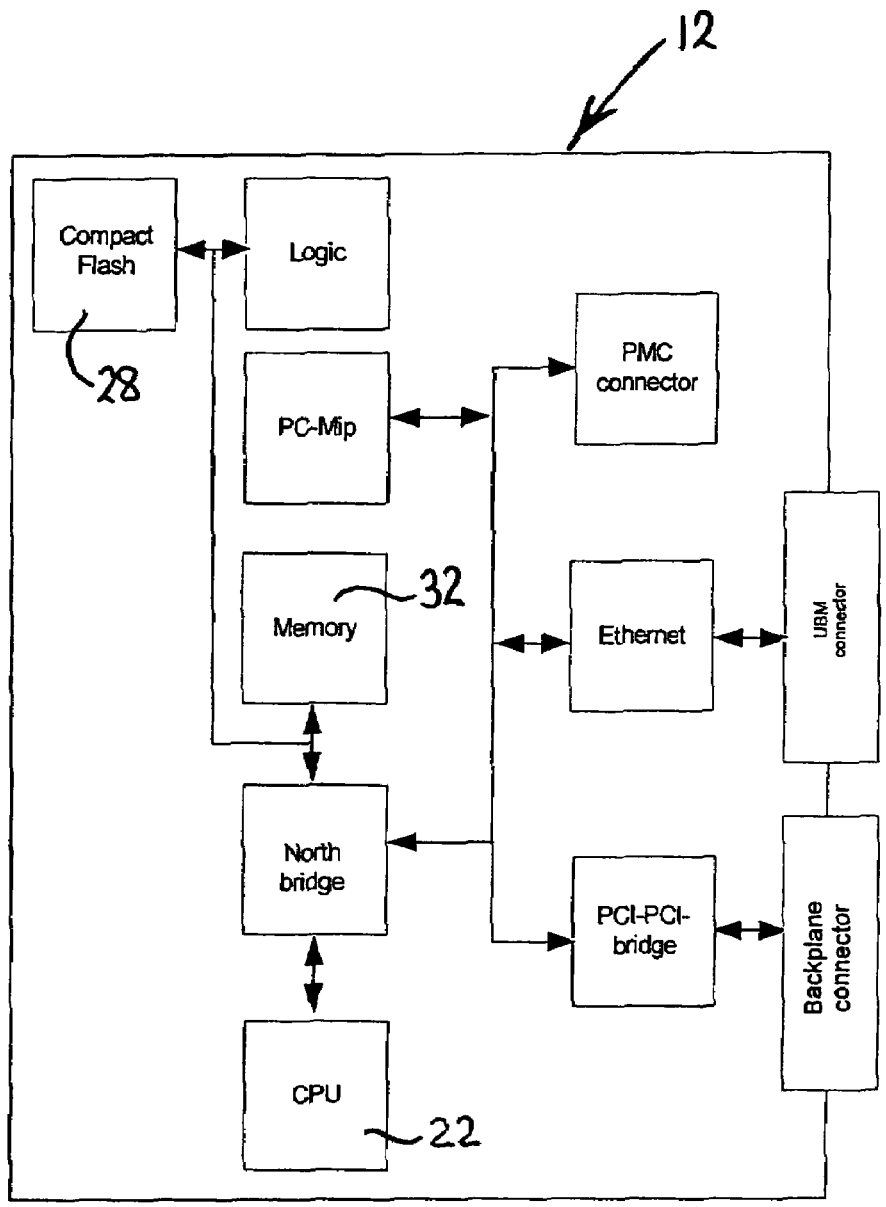
FIG. 2 is a schematic view of a numerical module of the protective relay.

Referring now to FIGS. 1 and 2, the present invention is directed to a protective relay 10 for detecting faults in a power circuit and tripping circuit breakers in response thereto. The protective relay 10 may be a directional protective relay, a differential protective relay, or a distance protective relay. The protective relay 10 has a modular construction and includes a power supply module, a combined backplane module, a transformer input module, an analog-to-digital (A/D) conversion module, a universal backplane module and a numerical module 12 (shown schematically in FIG. 2), all of which are interconnected by a backplane. The protective relay 10 also includes a human machine interface (HMI) 14 (shown in FIG. 1) having a display screen 16 and a plurality of input keys 18 through which information may be input to the protective relay 10. The combined backplane module carries all internal signals between the modules in the protective relay 10. The transformer input module receives and transforms voltage and current signals from voltage and current sensors connected to the power circuit being protected and galvanically separates these signals from the rest of the circuitry of the protective relay 10. The universal backplane module forms part of the backplane and connects the transformer input module to the A/D conversion module. The universal backplane module is also connected to the numerical module 12. Analog signals from the current and voltage sensors are converted to digital signals by A/D converters in the A/D conversion module. Referring now to FIG. 2, the numerical module 12 includes a central processing unit (CPU) 22, flash memory 28 and dynamic random access memory (DRAM) 32. Software control logic 40 is stored in the flash memory using a flash file system. During power up of the protective relay 10, the control logic 40 is transferred to the DRAM 32. The CPU 22 accesses the control logic 40 in the DRAM 32 and executes it. The control logic 40 includes a general control logic 42 and a delta filter control logic 44, which has first, second, third, fourth, fifth and sixth logic portions 46, 48, 50, 52, 54, 56 as shown in FIG. 3.

The control logic 40 may be written in a graphical programming language that utilizes function blocks. A function block performs a specific function and typically has at least one input variable, at least one output variable, one or more internal variables and an internal behavior description. A function block may also have a through variable. The internal behavior can be driven by continuous or discrete time, or can be event driven. A function block operates in conjunction with other function blocks (via communications called links) to implement a control strategy or scheme. A function blocks typically perform one of an input function (such as that associated with a transmitter, a sensor or other variable measurement device), a logic or variable manipulation function (such as adding, subtracting, multiplying, etc.), or an output function which performs a control or indication function. In the description below, the delta filter control logic 44 is described in terms of being written in a graphical programming language using function blocks, which are simply referred to as "blocks".

The general control logic 42 is operable to generally detect a fault in any one or more phases of a power circuit and to generate a trip signal 58. The delta filter control logic 44 interacts with the general control logic 42 to specifically detect which phases in the power circuit are faulted. Depending on the particular type of the protective relay 10, the general control logic 42 may utilize a directional protection scheme, a differential protection scheme or a distance protection scheme, as described above. If the general control logic 42 detects a fault, the trip signal 58 has a value of Boolean one. In one particular embodiment of the present invention, the general control logic 42 is a mho scheme that determines a fault has occurred if measured impedance points stay within the impedance circle in the RX diagram for more than a predefined period of time.

Figure 3:
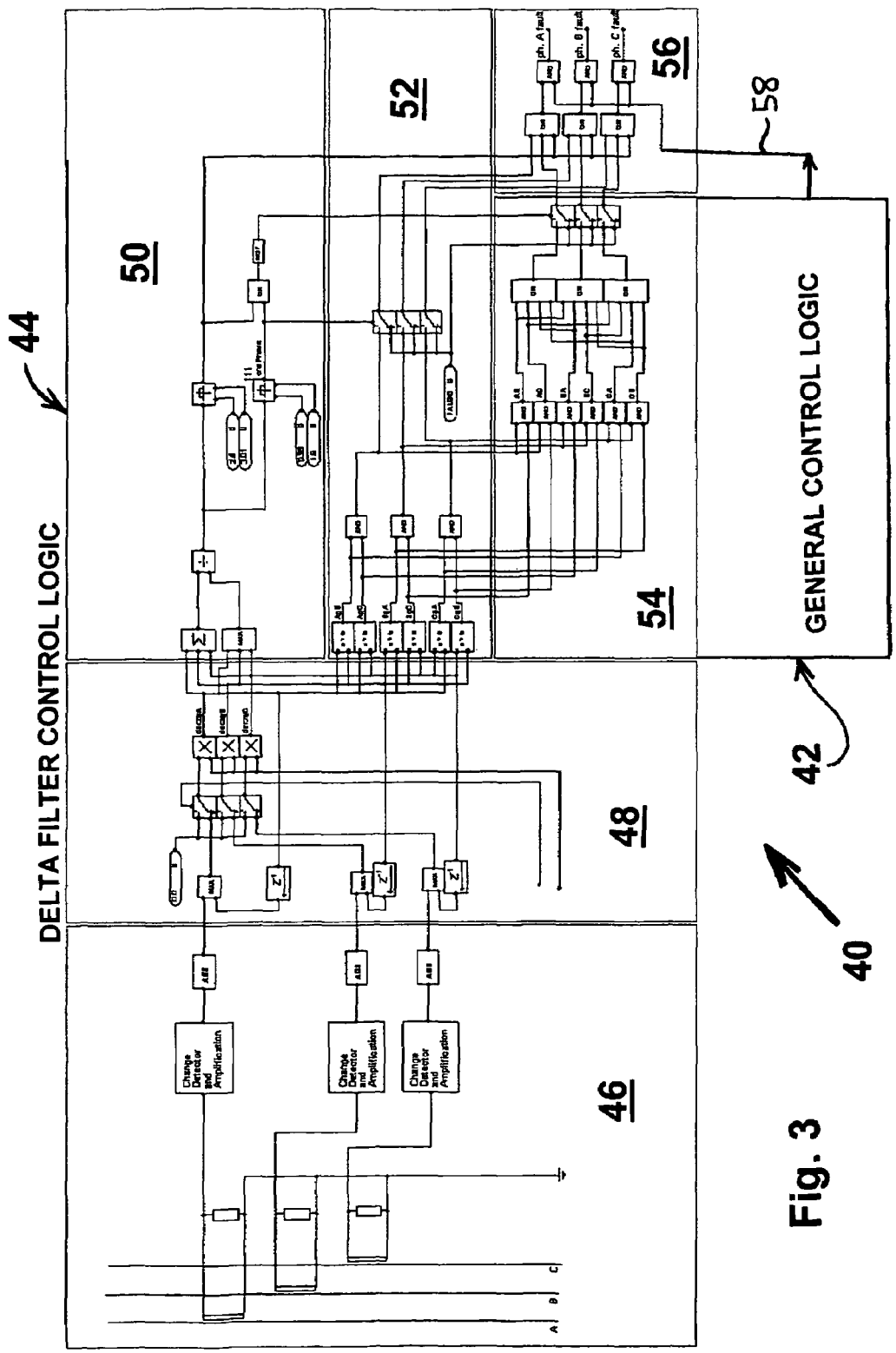
FIG. 3 is diagram of control logic stored in and executed by a processor in the protective relay.
Figure 4:
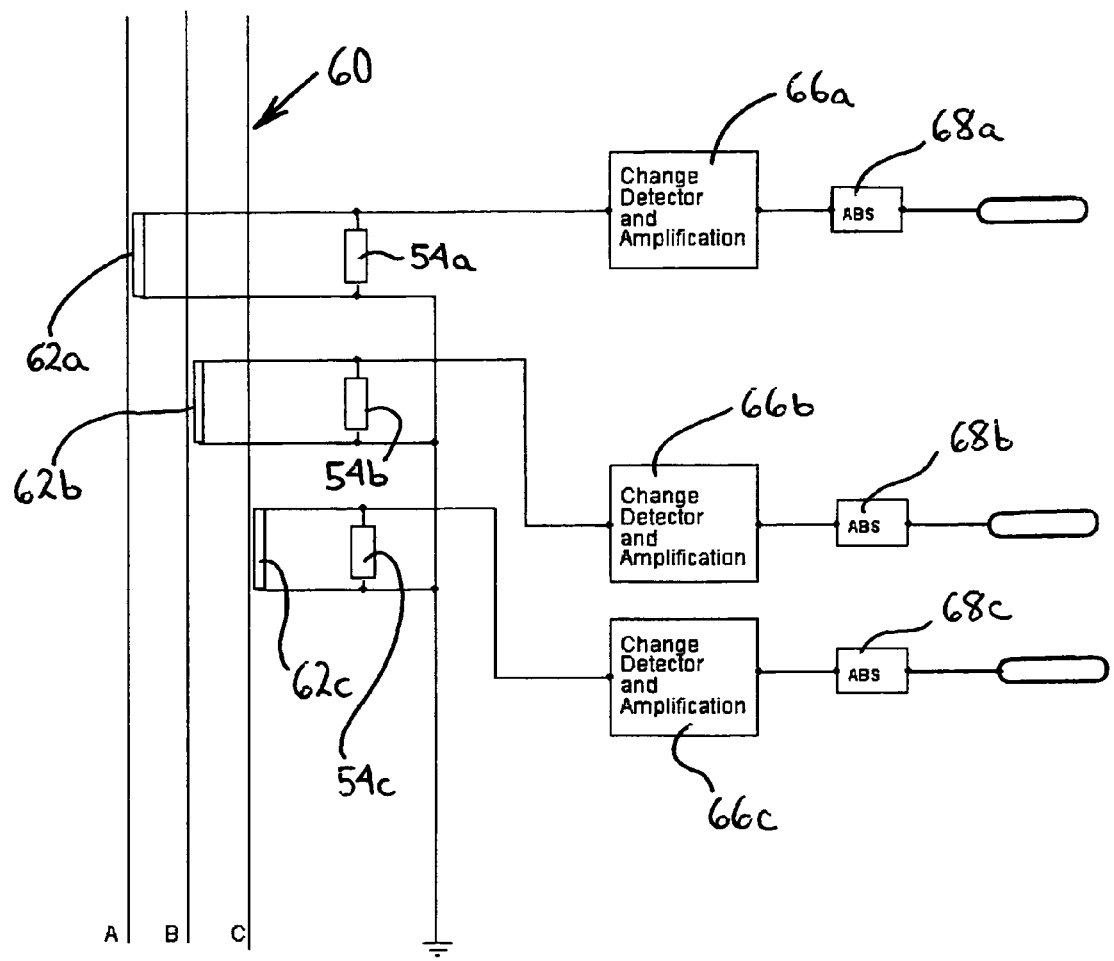
FIG. 4 is a diagram of a first portion of the control logic.

Referring now to FIGS. 3 and 4, the protective relay is 10 is shown connected to a power network 60 having three phases, which are designated A, B and C. Each phase includes a current transformer 62. For each phase, a resistor 54 is connected across the current transformer 62 to provide a voltage signal proportional to the current flowing in the phase. The voltage signals are fed to the A/D conversion module 18 of the protective relay 10 and converted to digital signals, which are provided to the control logic 40 running in the CPU 22. In the control logic 40, each digitized voltage signal (representing the current of a phase) is fed to a detector block 66 that includes a band exclusion filter and an amplifier. The band exclusion filter removes the component of the signal having the same frequency as the nominal operating frequency of the power network 40. The filtered signal is amplified in the amplifier and then supplied to an absolute value block 68, which determines an absolute value of the amplified signal. Under normal conditions (i.e., no faults in the power network 60), this absolute value signal is zero or around zero, due to noise in the power network 60 and measurement and filtering imperfections. When a change (e.g. a fault) occurs in the power network 60, the absolute value signal will spike. If the change persists, the absolute value signal will drop back to zero or around zero. Therefore, a typical fault will be detected twice: first at its inception, and then when the fault clears, either by itself or when a breaker opens.

In FIGS. 4-8, the first through sixth logic portions 48, 50, 52, 54, 56 of the delta filter control logic 44 are shown in a separated manner. The signals transmitted between the portions are shown connected together using input and output connection bubbles. Each input connection bubble contains the reference number of the function block or other component from which the signal comes.

Figure 5:
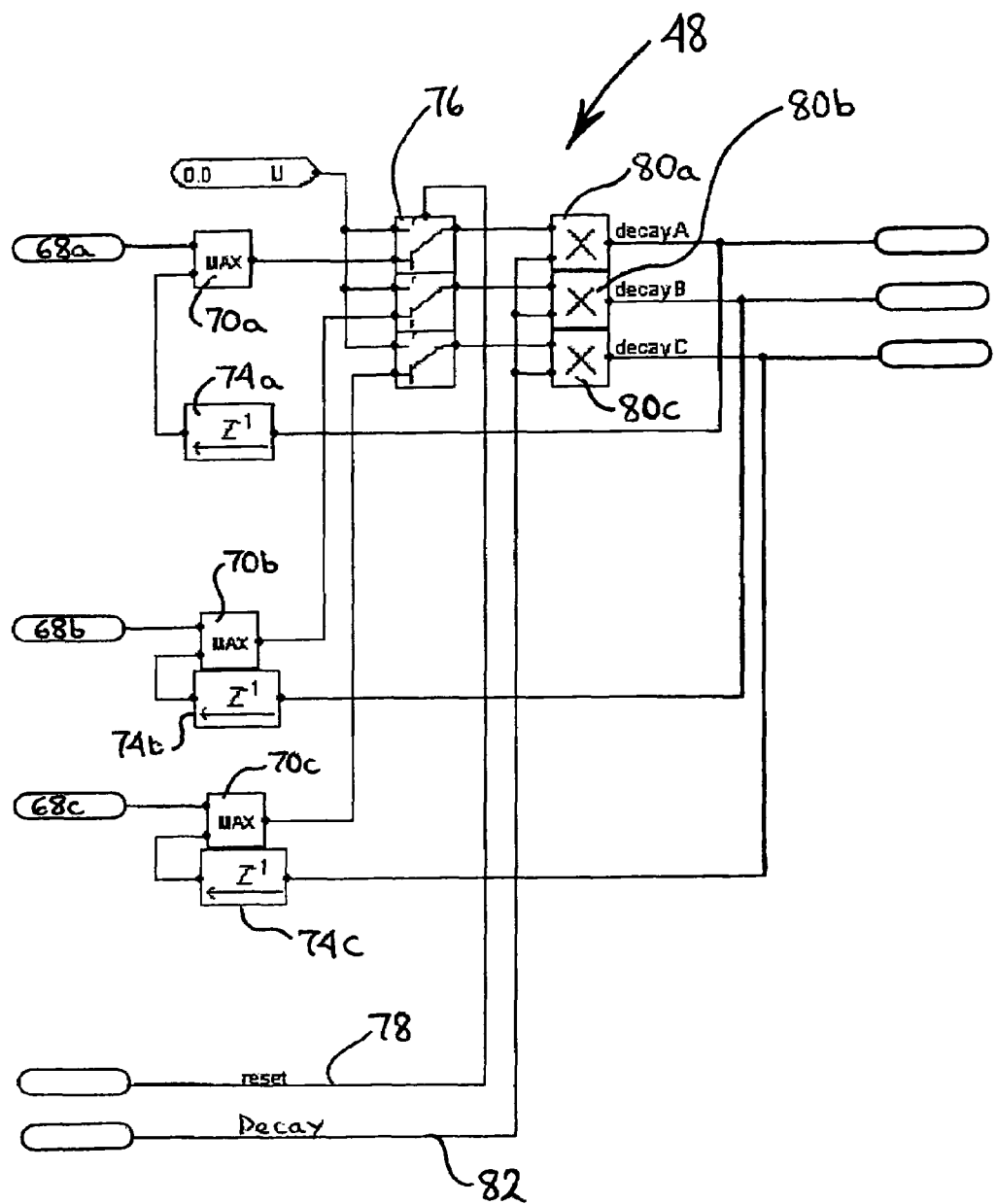
FIG. 5 is a diagram of a second portion of the control logic.

Referring now to FIG. 5, the second section 48 of the control logic 40 is shown. For each phase, a first input of a maximum block 70 is connected to an output of the absolute value block 68 and a second input of the maximum block 70 is connected to an output of a memory block 74. The maximum block 70 is operable to output the greater of its first and second inputs. The outputs of the maximum blocks 70 for the three phases A, B, C are connected to false inputs of a switch 76. A zero value block is connected to true inputs of the switch 76. A reset signal 78 is provided to a control input of the switch 76. The control input (and therefore the reset signal 78) controls the operation of the switch 76. When the reset signal 78 is true (a Boolean one), outputs of the switch 76 are set to the true inputs (i.e., zero), whereas when the reset signal is false (a Boolean zero), the outputs of the switch 76 are set to the false inputs, i.e., the outputs of the maximum blocks 70a, 70b, 70c. The outputs of the switch 76 are connected to first inputs of multiplier blocks 80a, 80b, 80c, respectively. Second inputs of the multiplier blocks 80a,b,c are connected to a decay signal 82, which may be set and modified by a user through the HMI 14. The decay signal 82 has a value in a range of from about 0.5 to about 0.99. Typically, the decay signal 82 has a value of about 0.97. Thus, the output signals from the switch 76 are reduced by a percentage in a range of from about 1% to about 50% and more particularly by a percentage of about 3%. These reduced output signals are hereinafter referred to as the phase decay signals.

The phase decay signals are input to the memory blocks 74a, 74b, 74c, respectively. In each phase, the memory block 74 delays the decay signal 86 by one cycle. The memory block 74 ensures that any transient spike in the absolute value signal from the absolute value block 68 is captured. When the reset signal 78 is true, the reset signal 78 resets the memory blocks 74a, 74b, 74c, respectively. The reset signal 78 may be momentarily set to a Boolean one by a user through the HMI 14.

In addition to being input to the memory blocks 74a,b,c in the second logic portion 48, the phase decay signals are transmitted to the third logic portion 50 and the fourth logic portion 52.

Figure 6:
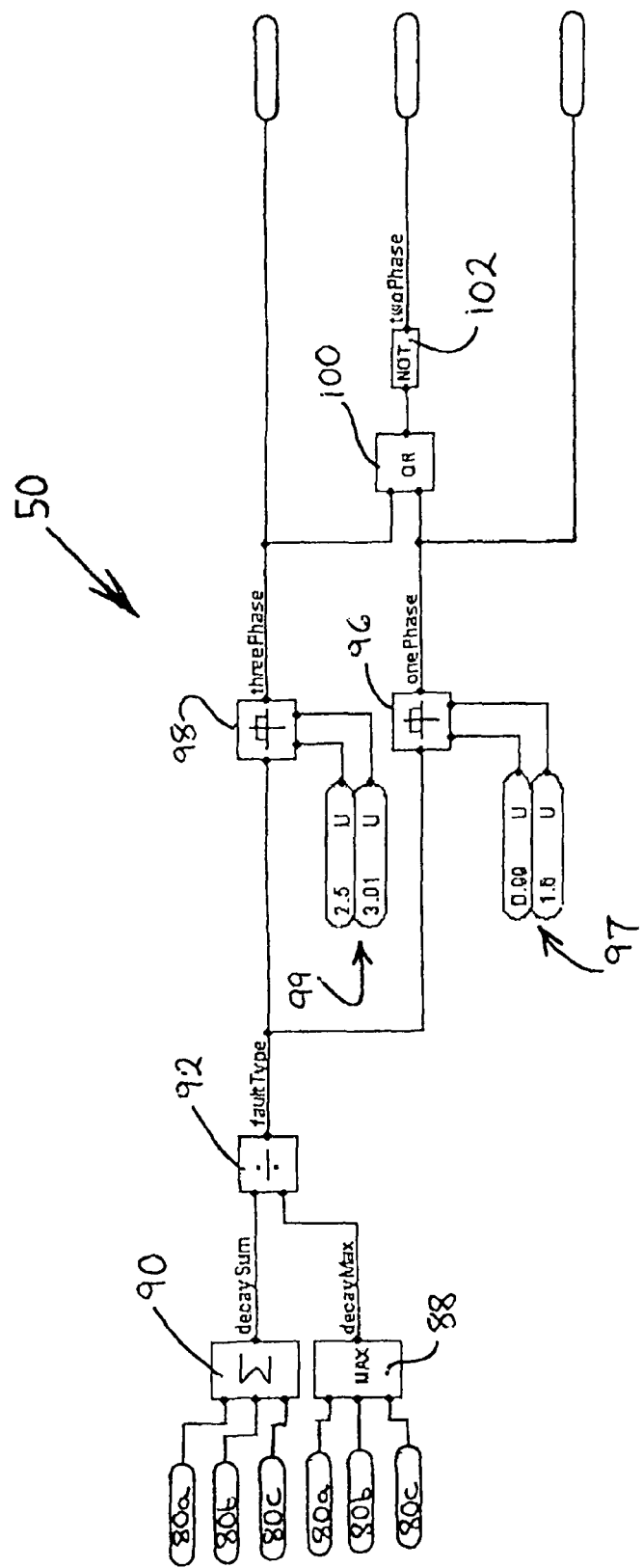
FIG. 6 is a diagram of a third portion of the control logic.

Reference is now made to the third logic portion 50, which is shown in FIG. 6. In the third logic portion 50, each phase decay signal is connected to an input of a maximum block 88 and an input of a sum block 90. The maximum block 88 is operable to output the greatest of its inputs (i.e., the largest of the phase decay signals) and the sum block 90 is operable to output the sum of its inputs (i.e., the sum of the phase decay signals). The output of the sum block 90 is connected to a first input of a divider block 92. A second input of the divider block 92 is connected to the output of the maximum block 88. The divider block 92 is operable to divide its first input by its second input (i.e., to divide the sum of the phase decay signals by the maximum phase decay signal) and to output the resulting quotient, which is called "faultType". The faultType has a value between about 1.0 and about 3.0. When the faultType is 1.0, a one phase fault is present; when the faultType is 2.0, a two phase fault is present; and when faultType is 3.0, either a three phase fault is present, or a normal condition exists. Due to induced harmonics in the non-faulted phase(s), tolerances are added to better discriminate between types of faults. It has been empirically determined that a range of about 1 to about 1.6 will adequately capture a single phase fault, a range of about 1.6 to about 2.5 will capture a two phase fault, and a range of about 2.5 to about 3.0 will represent a three phase fault or normal line conditions. The tolerance ranges for a single phase fault and a three phase fault are implemented using range blocks 96, 98, respectively. The range block 96 is operable to output a Boolean one if the faultType has a value in a range of 0.99 to 1.6, while range block 98 is operable to output a Boolean one if the faultType has a value in a range of 2.5 to 3.01. Inputs 97 determine the tolerance range in the range block 96, while inputs 99 determine the tolerance range in the range block 98. The inputs 97, 99 may be set and modified by a user through the HMI 14. The outputs of the range blocks 96, 98 are input to an OR block 100, which, in turn, has its output connected to a NOT block 102. In this manner, if there is no single phase fault (a Boolean zero from range block 96) and no potential three phase fault (a Boolean zero from range block 98), a two phase fault is determined to exist (i.e., a Boolean one is output from NOT block 102.

Figure 7:
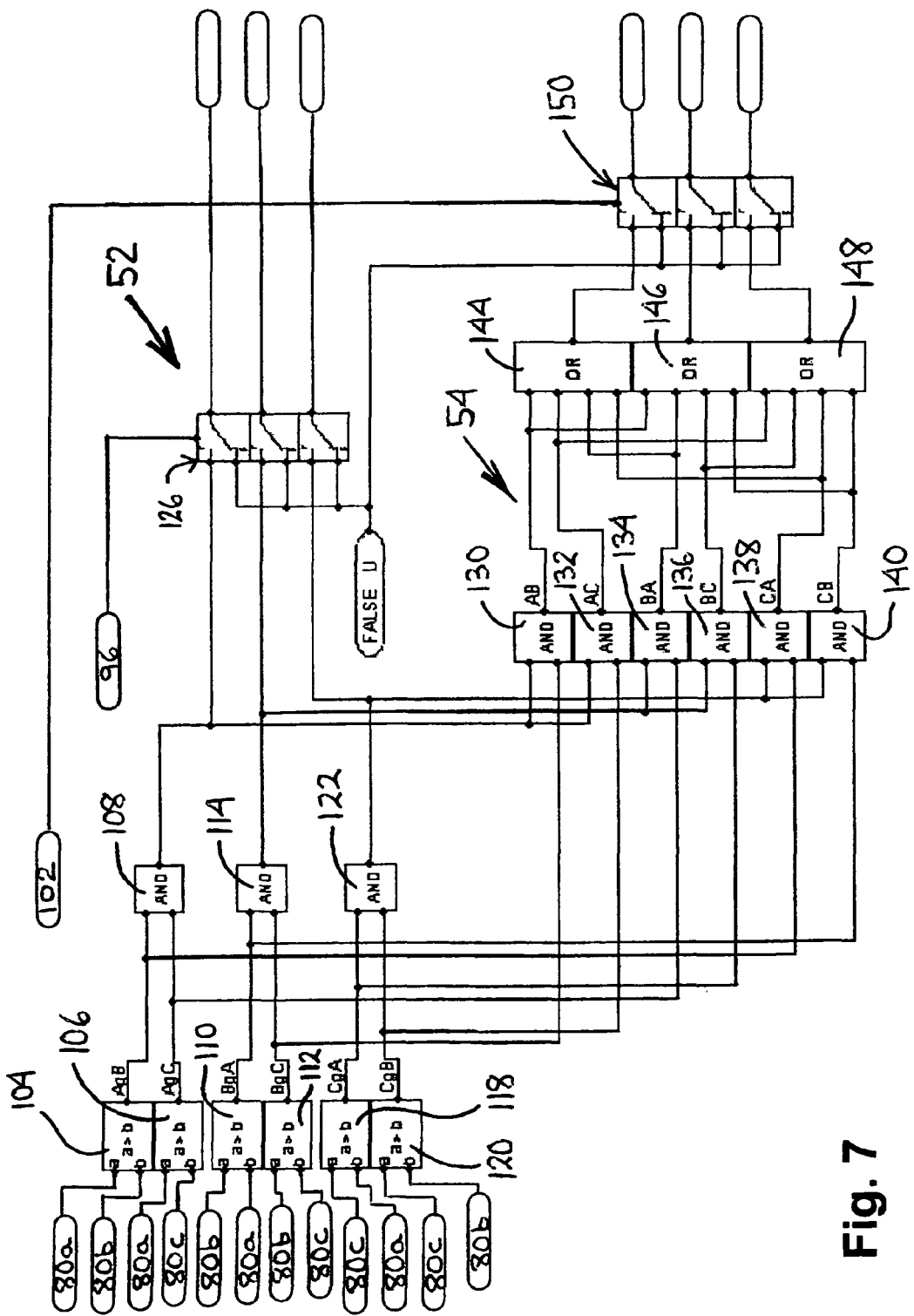
FIG. 7 is a diagram of fourth and fifth logic portions of the control logic.

Referring now to FIG. 7, the fourth logic portion 52 determines the largest of the phase decay signals. Greater than blocks 104, 106 and an AND block 108 determine whether the phase decay signal for phase A is the largest; greater than blocks 110, 112 and an AND block 114 determine whether the phase decay signal for phase B is the largest; and greater than blocks 118, 120 and an AND block 122 determine whether the phase decay signal for phase C is the largest. The AND blocks 108, 114, 122 produce true/false greater-than signals, which are propagated through the True inputs of a switch 126. False inputs of the switch 126 are connected to a false value (Boolean zero). A control input of the switch 126 is connected to the output of the range block 96, which indicates whether a single phase fault has occurred. If a single phase fault is determined to have occurred, the output of the range block 96 is a Boolean one and the outputs of the switch 126 will propagate the largest of the three phases.

In addition to being provided to the switch 126, the greater-than signals are provided to AND blocks 130, 132, 134, 136, 138, 140 in the fifth logic portion 54, which is also shown in FIG. 7. The fifth logic portion 54 determines the two largest of the phase decay signals. The AND block 130 outputs a Boolean one if the phase decay signals for phases A and B are the largest; the AND block 132 outputs a Boolean one if the phase decay signals for phases A and C are the largest; the AND block 134 outputs a Boolean one if the phase decay signals for phases B and A are the largest; the AND block 136 outputs a Boolean one if the phase decay signals for phases B and C are the largest; the AND block 138 outputs a Boolean one if the phase decay signals for phases C and A are the largest; and the AND block 140 outputs a Boolean one if the phase decay signals for phases C and B are the largest. The outputs from the AND blocks 130-140 are connected to OR blocks 144, 146, 148 such that the OR block 144 will output a Boolean one if the phase decay signal for phase A is one of the two largest, OR block 146 will output a Boolean one if the phase decay signal for phase B is one of the two largest, and OR block 148 will output a Boolean one if the phase decay signal for phase C is one of the two largest. The outputs of the OR blocks 144, 146, 148 are connected to True inputs of a switch 150. False inputs of the switch 150 are connected to a false value (Boolean zero). A control input of the switch 150 is connected to the output of the NOT block 102, which indicates whether a two phase fault has occurred. If a two-phase fault is determined to have occurred, the output of the NOT block 102 is a Boolean one and the outputs of the switch 150 are the outputs of the OR blocks 144, 146, 148, respectively.

Figure 8:
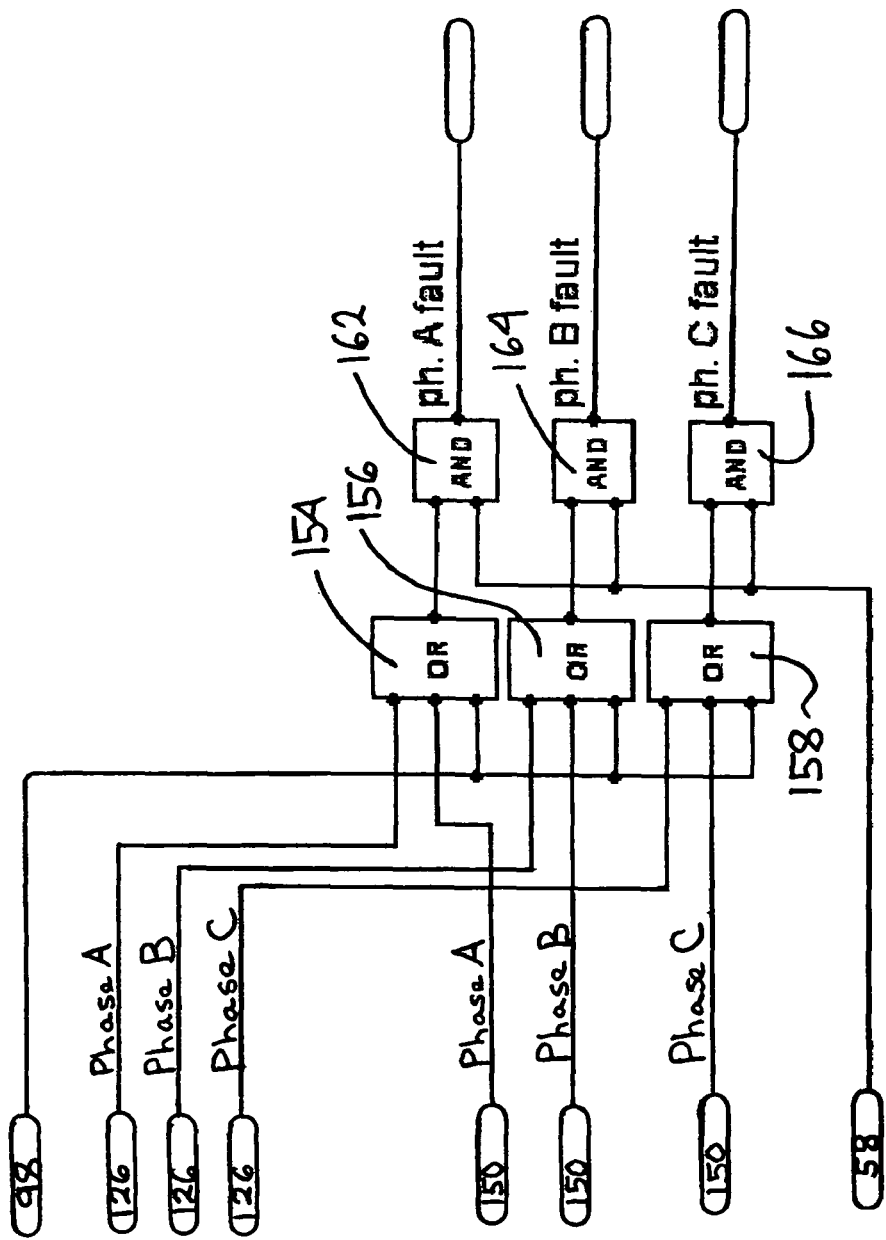
FIG. 8 is a diagram of a sixth logic portion of the control logic.

Referring now to FIG. 8, the sixth logic section 56 is shown. The sixth logic section 56 combines the one, two and three phase results. The sixth logic section 56 includes OR blocks 154, 156, 158. Each of the OR block 154, 156, 158 has an input connected to the output of the range block 98 (which indicates whether there is a three-phase fault or a normal condition), an input connected to the corresponding output of the switch 126 (which indicates whether the corresponding phase is at fault during a single phase fault), and an input connected to the corresponding output of the switch 150 (which indicates whether the corresponding phase is at fault during a two phase fault). Thus, for each of the OR blocks 154, 156, 158, a Boolean one at any of the inputs will produce a Boolean one at the output, which indicates a fault in the corresponding phase (or a normal condition in all of the phases).

As described above, the output of the range block 98 will be a Boolean one if there is either a three-phase fault or a normal condition. Thus, a normal condition will cause the outputs of the OR blocks 154, 156, 158 to be Boolean ones. In order to distinguish between a three-phase fault and a normal condition, outputs of the OR blocks 154, 156 and 158 are connected to first inputs of AND blocks 162, 164, 166, respectively. Second inputs of the AND blocks 162, 164, 166 are connected to the trip signal 58 from the general control logic 42, which indicates whether the general control logic 42 has detected a fault. When the general control logic 42 detects a fault, the trip signal 58 is a Boolean one. In this manner, the delta filter control logic 44 will not determine that a three-phase fault has occurred unless the general control logic 42 also determines that a fault has occurred.

The outputs of the AND blocks 162, 164, 166 may be connected to circuit breakers for phases A, B and C, respectively. A Boolean one at the output of the AND block 162 will trip the circuit breaker for phase A, a Boolean one at the output of the AND block 164 will trip the circuit breaker for phase B and a Boolean one at the output of the AND block 166 will trip the circuit breaker for phase C.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A protective relay for providing protective control to a power system carrying three-phase power, the protective relay comprising: a processor; at least one computer readable medium; program instructions stored on the at least one computer readable medium and executable by the processor to perform a faulted phase detection method comprising: receiving signal values representative of electrical properties of the power carried by the power system; processing the signal values to produce processed signals, respectively, the processed signals having components of the signal values removed that are the same frequency as the nominal operating frequency of the power system; adding the processed signals to produce a sum; dividing the sum by a predetermined number to yield a quotient; determining whether the quotient falls within one of a plurality of predetermined ranges; and using the determination of whether the quotient falls within one of the predetermined ranges to determine whether the power system has a single-phase fault, a two-phase fault, or a three-phase fault.

2. The protective relay of claim 1, wherein the faulted phase detection method further comprises identifying each phase that has a fault.

3. The protective relay of claim 1, wherein the predetermined number is three.

4. The protective relay of claim 1, wherein the predetermined ranges comprise a first range and a second range, and wherein if the quotient falls within the first range, the power system is determined to have a single-phase fault, and if the quotient falls within the second range, the power system is determined to have a potential three-phase fault.

5. The protective relay of claim 4, wherein if the quotient does not fall within either the first range or the second range, the power system is determined to have a two-phase fault.

6. The protective relay of claim 5, further comprising second program instructions stored on the at least one computer readable medium and executable by the processor to perform a general fault detection method for detecting faults and generating a trip signal when a fault is detected.

7. The protective relay of claim 6, wherein the faulted phase detection method further comprises receiving the trip signal from the general fault detection method, and wherein the faulted phase detection method uses the trip signal from the general fault detection method to determine that a fault has occurred.

8. The protective relay of claim 7, wherein the faulted phase detection method determines that: the power system has a single-phase fault if the faulted phase detection method receives the trip signal from the general fault detection method and the faulted phase detection method determines that the quotient falls within the first range; the power system has a two-phase fault if the faulted phase detection method receives the trip signal from the general fault detection method and the faulted phase detection method determines that the quotient does not fall within either the first range or the second range; the power system has a three-phase fault if the faulted phase detection method receives the trip signal from the general fault detection method and the faulted phase detection method determines that the quotient falls within the second range; and the power system is normal if the faulted phase detection method does not receive the trip signal from the general fault detection method and the faulted phase detection method determines that the quotient falls within the second range.

9. The protective relay of claim 8, wherein the protective relay is a distance protective relay and the general fault detection method uses a mho detection method.

10. The protective relay of claim 4, wherein the first range is from about 1.0 to about 1.6 and the second range is from about 2.5 to about 3.0.

11. The protective relay of claim 10, further comprising a human machine interface and wherein the first and second ranges are user selectable through the human machine interface.

12. A method for providing protective control to a power system carrying three-phase power, the method comprising: receiving signal values representative of electrical properties of the power carried by the power system; processing the signal values to produce processed signals, respectively, the processed signals having components of the signal values removed that are the same frequency as the nominal operating frequency of the power system; adding the processed signals to produce a sum; dividing the sum by a predetermined number to yield a quotient; determining whether the quotient falls within one of a plurality of predetermined ranges; and using the determination of whether the quotient falls within one of the predetermined ranges to determine whether the power system has a single-phase fault, a two-phase fault, or a three-phase fault.

13. The method of claim 12, further comprising identifying each phase that has a fault.

14. The method of claim 12, wherein the predetermined number is three.

15. The method of claim 12, wherein the predetermined ranges comprise a first range and a second range, and wherein if the quotient falls within the first range, the power system is determined to have a single-phase fault, and if the quotient falls within the second range, the power system is determined to have a potential three-phase fault.

16. The method of claim 15, wherein if the quotient does not fall within either the first range or the second range, the power system is determined to have a two-phase fault.

17. The method of claim 16, further comprising detecting whether there is a fault in the power system using a fault protection scheme selected from the group consisting of a directional protection scheme, a differential protection scheme and a distance protection scheme.

18. The method of claim 17, wherein the step of determining whether the power system has a single-phase fault, a two-phase fault, or a three-phase fault comprises: determining that the power system has a single-phase fault if the fault protection scheme detects a fault and the quotient is determined to fall within the first range; determining that the power system has a two-phase fault if the fault protection scheme detects a fault and the quotient is determined not to fall within either the first range or the second range; determining that the power system has a three-phase fault if the fault protection scheme detects a fault and the quotient is determined to fall within the second range; and determining that the power system is normal if the fault protection scheme does not detect a fault and the quotient is determined to fall within the second range.

19. The protective relay of claim 17, wherein the protective relay is a distance protective relay and the fault protection scheme comprises a distance protection scheme.

20. The protective relay of claim 19, wherein the distance protection scheme comprises a mho detection scheme.

* * * * *